(12) United States Patent  
Adachi

(10) Patent No.: US 7,923,899 B2  
(45) Date of Patent: Apr. 12, 2011

(54) ULTRASONIC ACTUATOR

(75) Inventor: Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/697,394

(22) Filed: Feb. 1, 2010

(65) Prior Publication Data

US 2010/0133956 A1    Jun. 3, 2010

Related U.S. Application Data

(63) Continuation of application No. 12/469,300, filed on May 20, 2009, now Pat. No. 7,683,523, which is a continuation of application No. PCT/JP2008/000598, filed on Mar. 14, 2008.

(30) Foreign Application Priority Data

Mar. 15, 2007   (JP) ................................. 2007-066587

(51) Int. Cl.  
*H02N 2/00*   (2006.01)

(52) U.S. Cl. .............................. 310/323.14; 310/323.16

(58) Field of Classification Search ............. 310/323.13, 310/323.14, 323, 26, 323.17  
See application file for complete search history.

(56) References Cited

U.S. PATENT DOCUMENTS

| | | | |
|---|---|---|---|
| 5,132,582 A | 7/1992 | Hayashi et al. | |
| 7,602,104 B2 * | 10/2009 | Sakamoto | 310/323.09 |
| 7,683,523 B2 * | 3/2010 | Adachi | 310/323.13 |
| 2007/0096598 A1 * | 5/2007 | Ichikawa et al. | 310/323.02 |
| 2009/0026884 A1 | 1/2009 | Adachi et al. | |
| 2009/0091213 A1 | 4/2009 | Adachi | |
| 2009/0224630 A1 * | 9/2009 | Adachi et al. | 310/317 |
| 2009/0224631 A1 | 9/2009 | Mukae | |
| 2009/0224718 A1 * | 9/2009 | Honjo et al. | 318/672 |
| 2009/0230818 A1 | 9/2009 | Mukae et al. | |
| 2009/0256445 A1 | 10/2009 | Kotani et al. | |
| 2010/0181870 A1 * | 7/2010 | Nagaoka et al. | 310/323.16 |

FOREIGN PATENT DOCUMENTS

JP          05-278890          10/1993

(Continued)

OTHER PUBLICATIONS

International Search Report and Written Opinion for corresponding Application No. PCT/JP2008/000598 mailed Jun. 17, 2008.  
Form PCT/ISA/237.  
Co-pending U.S. Appl. No. 12/469,300 filed May 20, 2009 (allowed claims provided).

*Primary Examiner* — Thomas M Dougherty  
(74) *Attorney, Agent, or Firm* — Renner, Otto, Boisselle & Sklar, LLP

(57) ABSTRACT

An ultrasonic actuator (3) includes an actuator body (4) performing a plurality of vibrations including a bending vibration, and a driver element (5) which is attached to a long side surface (40b) of the actuator body (4), and outputs a driving force by making an orbit motion in response to the vibrations of the actuator body (4). The driver element (5) is provided with an attachment surface (51), and is attached to the long side surface (40b) with the attachment surface (51) in surface contact with the long side surface (40b). A width of the attachment surface (51) in the longitudinal direction of the long side surface (40b) is smaller than a maximum width of the driver element (5) in the longitudinal direction of the long side surface (40b).

9 Claims, 6 Drawing Sheets

FOREIGN PATENT DOCUMENTS

| JP | 07-231685 | 8/1995 |
| JP | 2004-304963 | 10/2004 |
| JP | 2005-328594 | 11/2005 |
| JP | 2007-028761 | 2/2007 |

* cited by examiner

ULTRASONIC ACTUATOR

CROSS-REFERENCE TO RELATED APPLICATION

This application is a continuation of U.S. application Ser. No. 12/469,300 filed May 20, 2009 now U.S. Pat. No. 7,683,523, which is a continuation of PCT International Patent Application No. PCT/JP2008/000598, filed on Mar. 14, 2008, which claims priority of Japanese Patent Application No. 2007-066587, filed on Mar. 15, 2007, the entire contents of which are expressly incorporated by reference herein.

TECHNICAL FIELD

The present invention relates to an ultrasonic actuator including an actuator body performing a plurality of vibrations including a bending vibration.

BACKGROUND

Conventionally, an ultrasonic actuator disclosed in Patent Document 1 has been known as an ultrasonic actuator including an actuator body performing a plurality of vibrations including a bending vibration.

The ultrasonic actuator of Patent Literature 1 includes an actuator body constituted of a piezoelectric element, and a driver element attached to the actuator body.

The actuator body is constituted of a flat plate-shaped piezoelectric element having a longitudinal direction. In the actuator body, a longitudinal vibration (i.e., a so-called expansion/contraction vibration) in the longitudinal direction of the piezoelectric element and a bending vibration in a lateral direction of the piezoelectric element are induced harmonically by respectively applying AC voltages having different phases to two electrode pairs, each of which includes diagonally aligned two electrodes. As a result, the driver element makes an orbit motion, more specifically, an elliptical motion, in a plane including the longitudinal direction and the lateral direction of the piezoelectric element.

The driver element is substantially in the shape of a hemisphere. Two driver elements are arranged on a long side surface of the actuator body. The long side surface is a surface which is normal to a vibration direction of the bending vibration of the actuator body, and is bent and deformed in response to the bending vibration of the actuator body. The two driver elements are arranged at positions on the long side surface corresponding to antinodes of the bending vibration where bending displacement is the maximum.

In the ultrasonic actuator thus configured, the driver elements are arranged in contact with the drive target. When the ultrasonic actuator is driven in this state, a driving force of the actuator body is transmitted to the drive target through the driver elements making the orbit motion as described above, and therefore the drive target is driven. At this time, the actuator body is biased toward the drive target, and is configured so that a friction force between the driver elements and the drive target is increased to efficiently transmit the driving force of the actuator body.

Patent Document 1: Published Japanese Patent Application No. 2004-304963

SUMMARY

However, similar to the ultrasonic actuator of Patent Document 1, in the structure in which the driver elements are arranged on the side surface normal to the vibration direction of the bending vibration of the actuator body, i.e., the surface to be bent and deformed, the bending and deformation of the side surface is affected by the driver elements more significantly as a contact area between the driver elements and the side surface becomes greater.

On the other hand, as the contact area between the driver elements and the side surface becomes smaller, the attachment of the driver element to the side surface becomes less firm. As described above, in the structure in which the driving force of the actuator body is transmitted to the drive target by the friction force between the driver elements and the drive target, firm attachment is required between the driver elements and the actuator body.

An object of the present invention is to simultaneously allow both suppressing the disturbance of the vibrations of the actuator body by the driver elements, and firmly attaching the driver elements to the actuator body.

To achieve the object, an ultrasonic actuator includes: an actuator body having a piezoelectric element and performing a bending vibration and a longitudinal vibration; and a driver element which is attached to a side surface of the actuator body normal to a vibration direction of the bending vibration, and outputs a driving force by making an orbit motion in a plane including the vibration direction of the bending vibration and a vibration direction of the longitudinal vibration in response to the vibrations of the actuator body, wherein the driver element is provided with an attachment surface, and is attached to the side surface with the attachment surface in surface contact with the side surface, and a width of the attachment surface in the vibration direction of the longitudinal vibration is smaller than a maximum width of the driver element in the vibration direction of the longitudinal vibration.

The width of the attachment surface in the vibration direction of the longitudinal vibration is smaller than the maximum width of the driver element in the vibration direction of the longitudinal vibration so as to reduce a contact area between the driver element and the actuator body. As a result, the disturbance of the vibrations of the actuator body by the driver element can be suppressed. Further, since the driver element and the actuator body are brought into surface contact, not into point contact or line contact, to keep a sufficient contact area, firm attachment of the driver element can be achieved.

Figure 1:
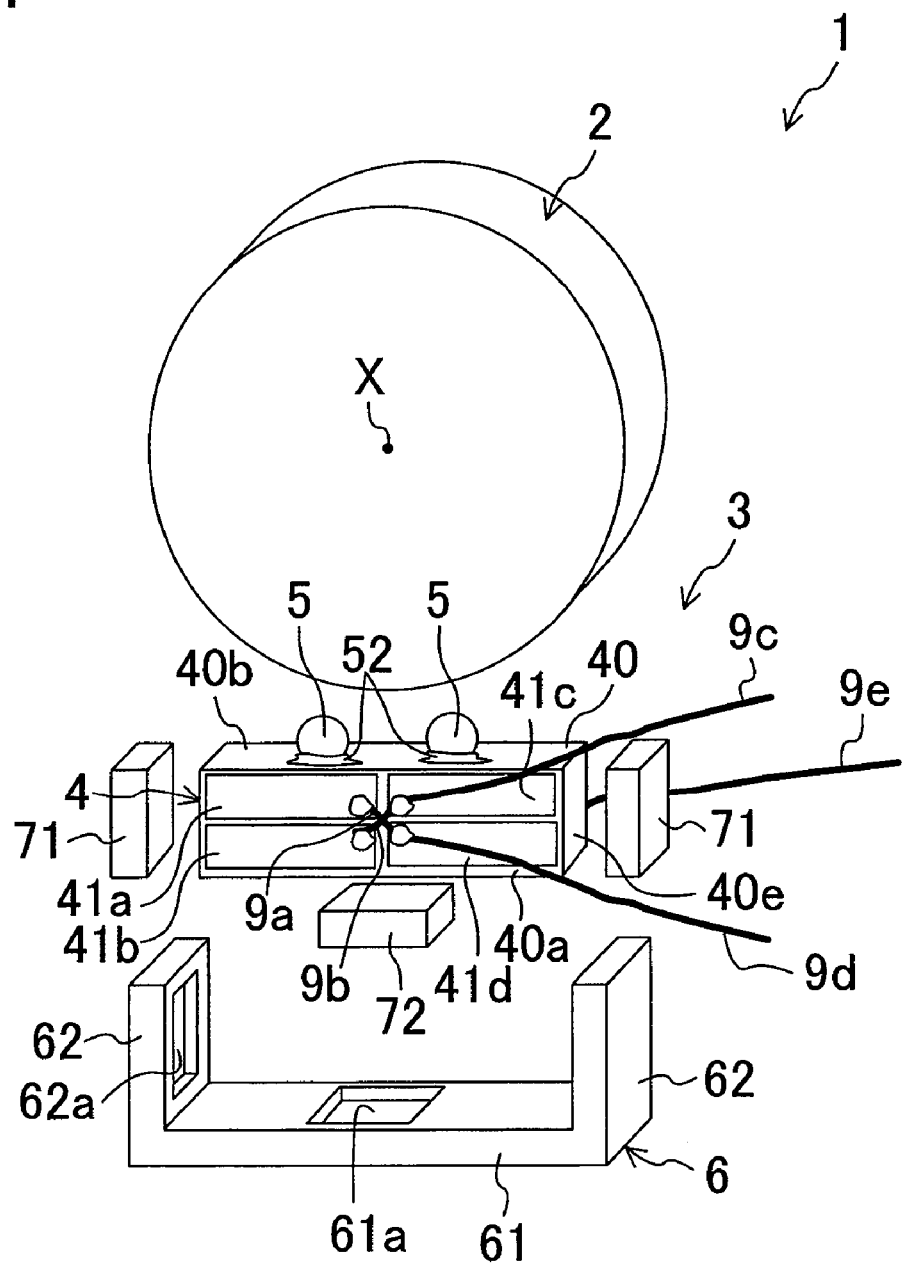
FIG. 1 is an exploded perspective view illustrating the structure of an ultrasonic actuator according to Embodiment 1.

EXPLANATION OF REFERENCE NUMERALS c Point of contact
n Normal
X Rotation axis
2 Disc body (drive target)
4, 204 Actuator body
40, 240a, 240b Piezoelectric element
40b, 242b Long side surface (side surface normal to vibration direction of bending vibration)
5, 205 Driver element
51, 251 Attachment surface

DETAILED DESCRIPTION OF THE PREFERRED EMBODIMENTS

Hereinafter, embodiments of the present invention will be described in detail with reference to the accompanying drawings.

Embodiment 1

Figure 2:
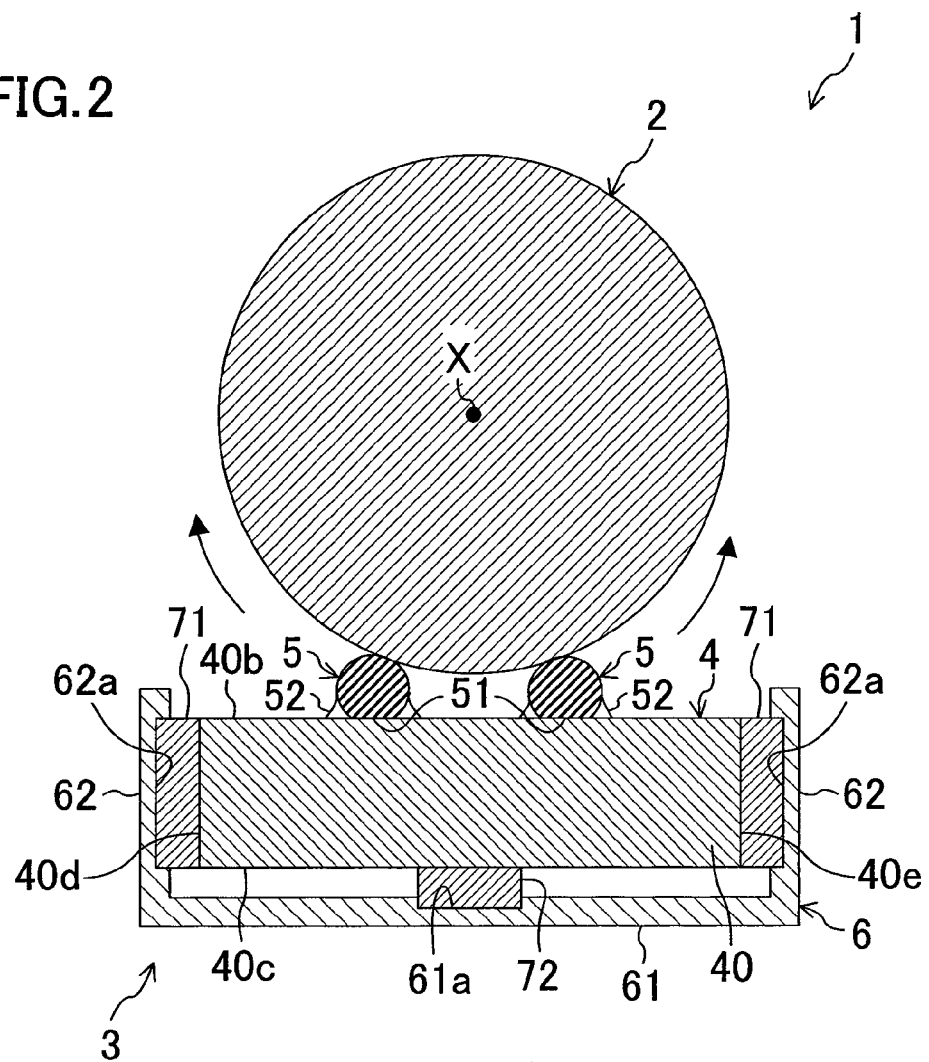
FIG. 2 is a sectional view illustrating the structure of the ultrasonic actuator.

A drive unit 1 according to Embodiment 1 of the present invention includes, as shown in FIGS. 1 and 2, a disc body 2, an ultrasonic actuator 3 for driving the disc body 2, and a control unit (not shown) for performing drive control to the ultrasonic actuator 3.

The disc body 2 is a disc having a rotation axis X as a center and made of alumina or other material. The disc body 2 is arranged rotatably around the rotation axis X. The disc body 2 constitutes a drive target.

The ultrasonic actuator 3 includes an actuator body 4 for generating a vibration, driver elements 5 for transmitting a driving force of the actuator body 4 to the disc body 2, a case 6 containing the actuator body 4, support rubbers 71 placed between the actuator body 4 and the case 6 to elastically support the actuator body 4, and a bias rubber 72 for biasing the actuator body 4 to the disc body 2.

The actuator body 4 includes a piezoelectric element 40 and power supply electrodes 41a to 41d formed on the piezoelectric element 40.

The piezoelectric element 40 is made of a piezoelectric material such as lead zirconate titanate or quartz, and shaped into a flat plate which is rectangular when viewed in plan. More specifically, the piezoelectric element 40 includes a pair of substantially rectangular principal surfaces 40a opposing to each other (only one of them is shown in FIG. 1), a pair of long side surfaces 40b and 40c which are orthogonal to the principle surfaces 40a, extend in a longitudinal direction of the principle surfaces 40a, and oppose to each other, and a pair of short side surfaces 40d and 40e which are orthogonal to both of the principle surfaces 40a and the long side surfaces 40b and 40c, extend in a lateral direction of the principle surfaces 40a, and oppose to each other.

On the principle surface 40a of the piezoelectric element 40, four power supply electrodes 41a to 41d are formed. More specifically, suppose that the principle surface 40a is divided in four quadrants, i.e., two areas in the longitudinal direction and two areas in the lateral direction, the power supply electrodes 41a to 41d are formed on the four quadrants, respectively. Among the power supply electrodes 41a to 41d, two diagonally aligned power supply electrodes, i.e., the power supply electrodes 41a and 41d, are electrically connected through a wire 9a, and the power supply electrodes 41b and 41c are electrically connected through a wire 9b. Wires 9c and 9d are connected to the power supply electrodes 41c and 41d, respectively, and the wires 9c and 9d are guided to the outside from through holes (not shown) provided in the case 6. That is, power can be supplied to the power supply electrodes 41b and 41c through the wire 9c, and to the power supply electrodes 41a and 41d through the wire 9d.

On the other principle surface of the piezoelectric element 40, a ground electrode (not shown) is formed substantially on the whole surface. A wire 9e is connected to the ground electrode. The wire 9e is also guided to the outside from a through hole (not shown) provided in the case 6.

The wires 9a to 9e are electrically connected to the corresponding electrodes by solders. The solders are positioned near the nodes of a first mode of a longitudinal vibration and a second mode of a bending vibration of the piezoelectric element 40 to be described later. That is, by connecting the wires 9a and 9e near the nodes of the vibrations of the piezoelectric element 40 by the solders, the disturbance of the vibrations of the piezoelectric element 40 by the solders can be suppressed as much as possible.

On the long side surface 40b of the piezoelectric element 40, the driver elements 5 are arranged to be spaced from each other in the longitudinal direction of the long side surface 40b (a direction corresponding to a vibration direction of the longitudinal vibration to be described later). The driver elements 5 are provided on parts of the long side surface 40b located at a distance of about 30% of the full length of the long side surface 40b inwardly from both edges thereof in the longitudinal direction, and on a center part of the long side surface 40b in the lateral direction (a thickness direction of the piezoelectric element 40). Each of the locations of the driver elements 5 corresponds to an antinode of a second mode of a bending vibration to be described later, where the bending vibration is the maximum. With the driver elements 5 arranged at these locations, the bending vibration of the piezoelectric element 40 can be utilized more effectively. The driver elements 5 can be arranged on other parts of the piezoelectric element than the nodes of the second mode of the bending vibration, i.e., non-node parts. As the non-node parts make displacement in response to the bending vibration, the bending vibration of the piezoelectric element 40 can be utilized.

Figure 3:
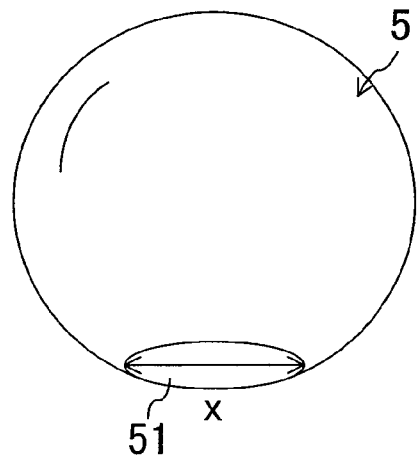
FIG. 3 is a perspective view of a driver element.

Each of the driver elements 5 is basically in the shape of a sphere which is partially truncated to form a flat section, as shown in FIG. 3. The section constitutes a round attachment surface 51. Each of the driver elements 5 is adhered to the long side surface 40b of the piezoelectric element 40 through the attachment surface 51 using an adhesive 52. The driver elements 5 may be made of zirconia, alumina, silicon nitride, silicon carbide, tungsten carbide, or other material.

The adhesive 52 is preferably softer than the material of the piezoelectric element 40 and the material of the driver elements 5. More specifically, the adhesive may be a synthetic resin, especially an epoxy resin or a silicone resin. With use of these materials, the driver elements 5 and the piezoelectric element 40 can be fixed to each other without affecting the bending vibration of the piezoelectric element 40 as much as possible.

The case 6 is formed of resin, and is substantially U-shaped when viewed from the front so as to cover the other long side surface 40c and the short side surfaces 40d and 40e of the piezoelectric element 40. The case 6 includes a long side wall portion 61 which is substantially rectangular and parallel to the long side surface 40c of the piezoelectric element 40, and short side wall portions 62 provided at short sides of the long side wall portion 61 at the longitudinal ends thereof, respectively. A recess 61a in which a bias rubber 72 to be described later will be arranged is formed in the longitudinal and lateral center of an inner surface of the long side wall portion 61. Further, a recess 62a in which a support rubber 71 to be described later will be arranged is formed in the longitudinal and lateral center of an inner surface of each of the short side wall portions 62.

The actuator body 4 is placed in the case 6 thus configured. The actuator body 4 is placed in the case 6 so that the other long side surface 40c of the piezoelectric element 40 opposes to the long side wall portion 61. In this state, the driver elements 5 protrude from the case 6.

The support rubbers 71 are provided between the short side surfaces 40d and 40e of the piezoelectric element 40 and the short side wall portions 62 of the case 6, respectively. Each of the support rubbers 71 is fitted in the recess 62a in the short side wall portion 62 and is in contact with the short side surface 40d (40e) of the piezoelectric element 40. The short side surfaces 40d and 40e of the piezoelectric element 40 correspond to nodes of the longitudinal vibration to be described later. However, since the support rubbers 71 are elastic bodies, they can support the piezoelectric element 40 without affecting the longitudinal vibration of the piezoelectric element 40.

A bias rubber 72 is placed between the other long side surface 40c and the long side wall portion 61 of the case 6. The bias rubber 72 is fitted in the recess 61a in the long side wall portion 61 and is in contact with the long side surface 40c of the piezoelectric element 40.

The support rubbers 71 and the bias rubber 72 are made of silicone rubber or other material.

Figure 4:
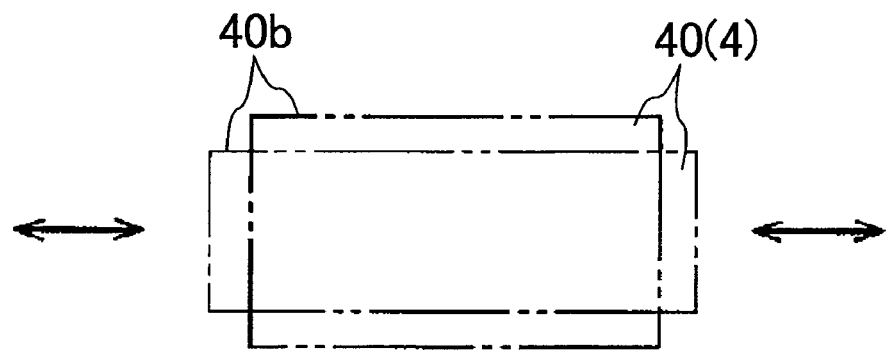
FIG. 4 is a conceptual diagram illustrating displacement made by a first mode of longitudinal vibration of a piezoelectric element.
Figure 5:
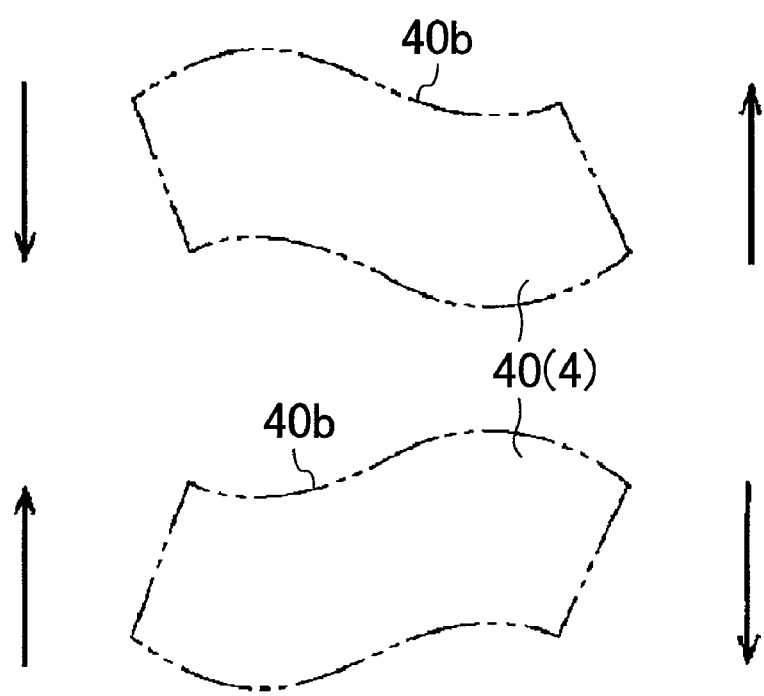
FIG. 5 is a conceptual diagram illustrating displacement made by a second mode of bending vibration of the piezoelectric element.

In the ultrasonic actuator 3 this configured, the wires 9c, 9d and 9e are connected to the control unit. With the wire 9e connected to the electrical ground, an AC voltage of a predetermined frequency is applied to the wire 9c, and an AC voltage having a phase shifted from the AC voltage applied to the wire 9 by 90° is applied to the wire 9d. As a result, AC voltages shifted from each other by 90° are applied to a pair of diagonally aligned power supply electrodes 41a and 41d and another pair of diagonally aligned power supply electrodes 41b and 41c on the principle surface 40a of the piezoelectric element 40, respectively. This induces the piezoelectric element 40 to generate the first mode of longitudinal vibration (so-called expansion/contraction vibration) shown in FIG. 4 and the second mode of bending vibration shown in FIG. 5. That is, the piezoelectric element 40 performs the longitudinal vibration in the longitudinal direction of the long side surface 40b and the bending vibration in the normal direction of the long side surface 40b.

Respective resonance frequencies of longitudinal vibration and bending vibration are determined by a material, a shape and the like of the piezoelectric element 40. Furthermore, the resonance frequencies both are influenced by force supporting the piezoelectric element 40 and a position where the piezoelectric element 40 is supported. Taking this into consideration, the resonance frequencies are substantially matched to each other. AC voltages having a frequency around the resonance frequencies and phases shifted by 90° from each other are applied to the wires 9c and 9d, respectively. Thus, the first mode of longitudinal vibration and the second mode of bending vibration are harmonically induced in the piezoelectric element 40, so that the piezoelectric element 40 changes itself into shapes shown in FIGS. 6(a), 6(b), 6(c) and 6(d) in this order.

As a result, each of the driver elements 5 provided on the piezoelectric element 40 makes an orbit motion, more specifically, a substantially elliptical motion, in a plane parallel to a principal surface 40a of the piezoelectric element 40 (i.e., a plane parallel to the page surface of FIG. 6), i.e., in a plane including the longitudinal direction (a vibration direction of the longitudinal vibration) and the normal direction (a vibration direction of the bending vibration) of the long side surface 40b of the piezoelectric element 40.

The ultrasonic actuator 3 thus configured is arranged such that the driver elements 5 are in contact with a circumferential surface of the disc body 2. That is, the ultrasonic actuator 3 is arranged so that the plane including the longitudinal and normal directions of the long side surface 40b of the piezoelectric element 40, i.e., the plane including the vibration directions of the longitudinal and bending vibrations, is orthogonal to the rotation axis X of the disc body 2. In this state, sections of the disc body 2 and the driver elements 5 which are orthogonal to the rotation axis X of the disc body 2, i.e., sections parallel to the plane including the longitudinal direction of the long side surface 40b of the piezoelectric element 40 (the vibration direction of the longitudinal vibration) and the vibration direction of the bending vibration, are substantially round (in a strict sense, the section of each of the driver elements 5 is almost round-shaped with a certain circular segment part cut off).

In this structure, the ultrasonic actuator 3 is in such a state that the bias rubber 72 is compressed and deformed to bias the driver elements 5 to the disc body 2 by the elastic force of the bias rubber 72. That is, the driver elements 5 are biased to the disc body 2 even when the ultrasonic actuator 3 is not driven. Since the bias rubber 72 is arranged on a perpendicular bisector of a line segment connecting the centers of the driver elements 5, and the driver elements 5 are biased in the direction of the perpendicular bisector by the bias rubber 72, the two driver elements 5 are biased to the disc body 2 with substantially the same biasing forces. Thus, the disc body 2 can be driven by the two driver elements 5 in good balance with stability.

Figure 6:
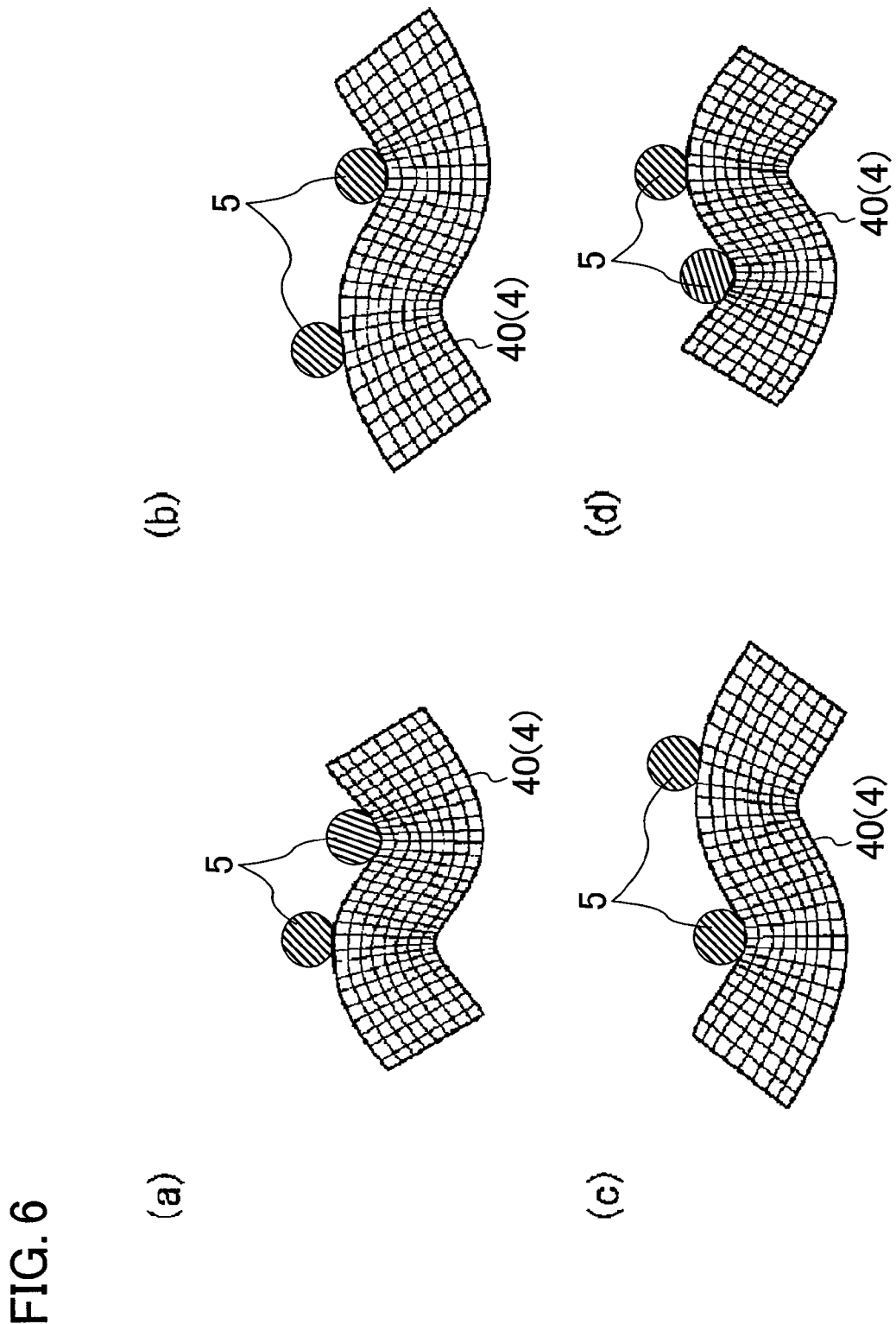
FIG. 6 is a conceptual diagram illustrating the operation of the piezoelectric element.

In this state, as described above, the wire 9c is connected to the electrical ground, an AC voltage at a predetermined frequency is applied to the wire 9d, and an AC voltage having a phase shifted from the AC voltage applied to the wire 9d by 90° C. is applied to the wire 9e. As a result, the ultrasonic actuator 3 induces the piezoelectric element 40 to generate a composite vibration of the longitudinal vibration and the bending vibration, so that the driver elements 5 make a substantially elliptical motion in a plane parallel to the principle surface 40a of the piezoelectric element 40. In this way, the driver elements 5 periodically repeat contacting to and detaching from the disc body 2, so that the disc body 2 is rotated about the rotation axis X by friction force. That is, the ultrasonic actuator 3 applies a driving force to the disc body 2 in the circumferential direction thereof. The two driver elements 5 make the substantially elliptical motion with their phases shifted by 180° from each other as shown in FIG. 6. Therefore, the driver elements 5 alternately drive the disc body 2.

Figure 7:
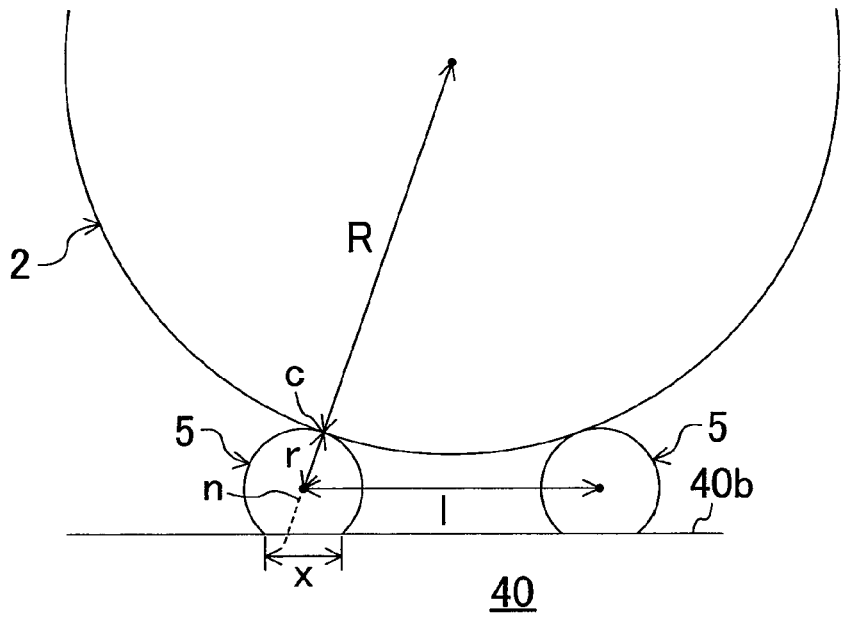
FIG. 7 is a sectional view illustrating the dimensions of the driver element and a disc body.

For the purpose of improving firm attachment to the piezoelectric element 40, the driver elements 5 are adhered to the long side surface 40b of the piezoelectric element 40 with the attachment surface 51 in surface contact with long side surface 40b. However, as the contact area between the driver element 5 and the long side surface 40b becomes greater, the driver elements 5 restrain the displacement of the long side surface 40b in a wider range, and the vibration of the piezoelectric element 40 is affected more significantly. Therefore, as shown in FIG. 7, suppose that the radius of the driver element 5 (the radius of the substantially spherical body) is r, the width of the attachment surface 51 in the longitudinal direction of the long side surface 40b (the vibration direction of the longitudinal vibration), i.e., the diameter x of the attachment surface 51 satisfies the following expression (1):

$$x<2r \tag{1}$$

Specifically, the width of the attachment surface 51 in the vibration direction of the longitudinal vibration (the diameter of the attachment surface 51) is defined smaller than the maximum width of the driver element 5 in the vibration direction of the longitudinal vibration (the diameter of the driver element 5).

However, in the structure similar to that described in the present embodiment in which a normal n at a point of contact c between the driver element 5 and the disc body 2 is inclined relative to the normal direction of the long side surface 40b in the vibration direction of the longitudinal vibration, a reaction force from the disc body 2 is applied to the driver element 5 in the direction of the normal n. In the case where the normal n passes through the attachment surface 51 of the driver element 5, the reaction force from the disc body 2 is exerted on the attachment surface 51 of the driver element. Part of the reaction force is exerted in the shearing direction of the attachment surface 51 and the long side surface 40b of the piezoelectric element 40, and the rest of which is exerted in the perpendicular direction of the attachment surface 51 and the long side surface 40b, i.e., the direction pressing the driver element 5 against the long side surface 40b. Thus, the reaction force can be received by the attachment surface 51 and the long side surface 40b. In contrast, in the case where the normal n does not pass through the attachment surface 51 of the driver element 5 but passes through the spherical surface of the driver element 5, the reaction force from the disc body 2 is exerted so as to raise the attachment surface 51 above the long side surface 40b with a point on the circumference of the attachment surface 51 as a fulcrum. Therefore, the driver element 5 may possibly come off the long side surface 40b.

Although the driver element 5 is in surface contact with and adhered to the long side surface 40b, it is preferable, for reliably preventing the driver element 5 from coming off the long side surface 40b, to define the diameter of the driver element 5 and the size of the attachment surface 51 so that the normal n at the point of contact c between the driver element 5 and the disc body 2 passes through the attachment surface 51 of the driver element 5.

In other words, suppose that the radius of the disc body 2 is R, and the distance between the centers of the two driver elements 5 in the longitudinal direction of the long side surface 40b (the vibration direction of the longitudinal vibration) is l, it is preferable that the diameter x of the attachment surface 51 satisfies the following expression (2):

$$x>rl/(R+r) \tag{2}$$

By meeting the expression, the reaction force from the disc body 2 can be received by the long side surface 40b of the piezoelectric element 40 through the attachment surface 51 of the driver element 5. This allows preventing the driver element 5 from coming off the long side surface 40b.

However, even in the case where the normal n passes through the attachment surface 51 of the driver element 5, when the normal n at the attachment surface 51 of the driver element 5 is inclined too much relative to the normal of the long side surface 40b, part of the reaction force from the disc body 2 exerted in the shearing direction of the attachment surface 51 and the long side surface 40b of the piezoelectric element 40 may become greater than the other part of the reaction force from the disc body 2 exerted in the perpendicular direction of the attachment surface 51 and the long side surface 40b. For this reason, it is preferable that the diameter x of the attachment surface 51 satisfies the following expression (3):

$$x<\sqrt{\sqrt{2}r} \tag{3}$$

By meeting the expression, the part of the reaction force from the disc body 2 exerted in the shearing direction of the attachment surface 51 and the long side surface 40b is reduced so that the driver element 5 can reliably be prevented from coming off the long side surface 40b.

Figure 8:
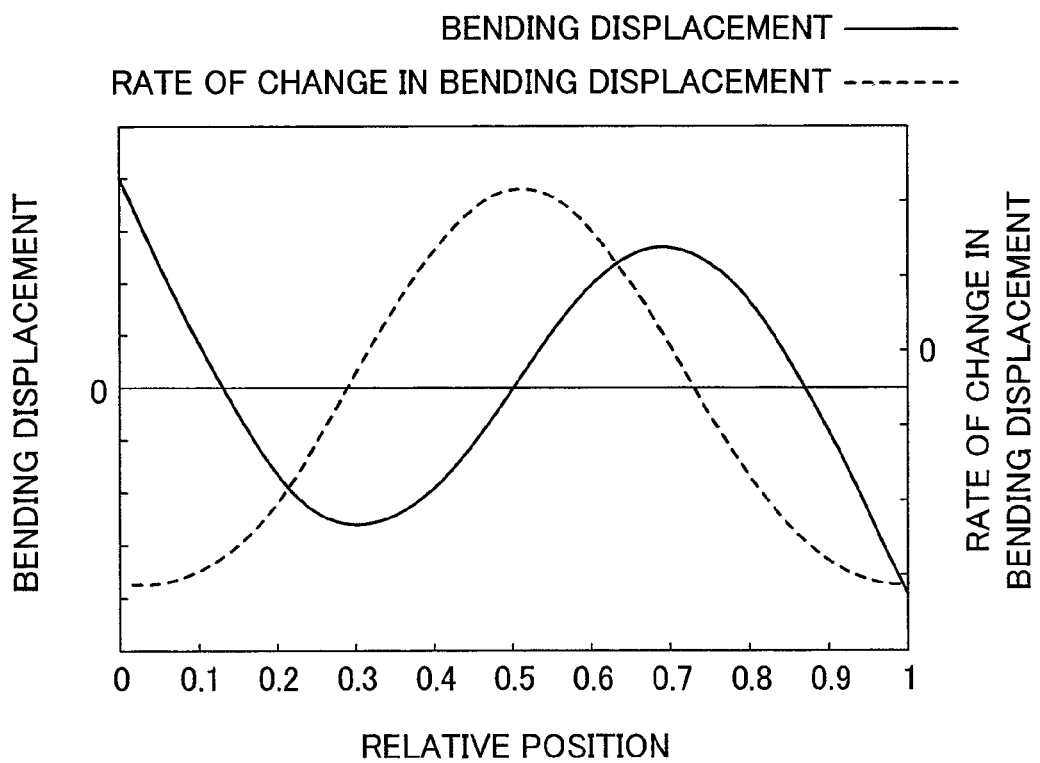
FIG. 8 is a graph illustrating displacement made by the bending vibration and the rate of change in displacement.

The displacement made by the bending vibration of the piezoelectric element 40 is as shown in FIG. 8. In FIG. 8, a lateral axis indicates the position of the long side surface 40b in the longitudinal direction, which is a relative position with respect to the full length of the long side surface 40b regarded as 1. A longitudinal axis indicates the displacement made by the bending vibration. A solid line in this figure denotes the displacement made by the bending vibration, in which extreme values are observed when the relative position is around 0.3 and 0.7. In order to efficiently transmit the bending vibration of the piezoelectric element 40 to the disc body 2, the driver elements 5 are preferably arranged at positions where the bending displacement is large, i.e., positions corresponding to the extreme values. Further, when adhered to the long side surface 40b, the driver elements 5 restrain the deformation of the long side surface 40b. Therefore, the driver elements 5 are preferably arranged at positions where the rate of change in bending displacement is low. A broken line in this figure denotes the rate of change in bending displacement, in which the rate of change in bending displacement is low around the extreme values, but increased as it is shifted from the extreme values. Therefore, even when the driver elements 5 are arranged at positions corresponding to the extreme values, the size of the attachment surface 51 is preferably defined within a range where the rate of change in bending displacement is low. Specifically, suppose that the full length of the long side surface 40b in the longitudinal direction is L, it is preferable that the diameter x of the attachment surface 51 satisfies the following expression (4):

$$x<L/10 \tag{4}$$

By meeting the expression, the driver element 5 can be attached to part of the long side surface 40b where the rate of change in bending vibration is low. As a result, the disturbance of the bending vibration of the piezoelectric element 40 by the adhesion of the driver element 5 to the long side surface 40b can further be prevented.

As the normal n at the point of contact between the driver element and the disc body 2 is more inclined relative to the normal direction of the long side surface 40b, i.e., to the vibration direction of the bending vibration, a period during which the driving force can be applied to the disc body 2 in the elliptical motion of the driver element 5 becomes shorter. Therefore, it is not preferable that the normal n is inclined very much relative to the normal of the long side surface 40b. Thus, it is preferable that the radius r of the driver element 5 satisfies the following expression (5):

$$r > \frac{l}{\sqrt{2}} - R. \tag{5}$$

By meeting the expression, the driving force generated by the actuator body 4 can efficiently be transmitted to the disc body 2.

According to Embodiment 1, in the structure in which the driver elements 5 are attached to the long side surface 40b of the piezoelectric element 40, which is the side surface which makes the bending deformation, the width of the attachment surface 51 of each of the driver elements 5 in the vibration direction of the longitudinal vibration, i.e., the diameter x, is defined smaller than the width of each of the driver elements 5 in the vibration direction of the longitudinal vibration, i.e., the diameter 2r, so that the contact area between each of the driver elements 5 and the long side surface 40b is reduced. This makes it possible to suppress the disturbance of the bending deformation of the long side surface 40b by the driver elements 5. Specifically, since the vibration direction of the longitudinal vibration (the longitudinal direction of the long side surface 40b) is a direction in which the bending vibration spreads (propagates), the restraint of the long side surface 40b by the attachment surface 51 is reduced by reducing the width of the attachment surface 51 in the vibration direction of the longitudinal vibration.

Although the contact area between the driver element 5 and the long side surface 40b is reduced, they are not brought into point contact or line contact. Instead, the driver element 5 is provided with the attachment surface 51 so that the driver element 5 is attached to the long side surface 40b with the attachment surface 51 in surface contact with the long side surface 40b. This allows securing firm attachment of the driver element 5 to the long side surface 40b. That is, both reduced disturbance of the vibration of the actuator body 4 by the driver element 5, and firm attachment of the driver element 5, can be achieved simultaneously.

In the structure in which the driver elements 5 are brought into contact with a surface not parallel to the long side surface 40b on which the driver elements 5 are arranged, e.g., the circumferential surface of the disc body 2, a reaction force exerted on the driver elements 5 by the drive target (the disc body 2) is inclined relative to the normal direction of the long side surface 40b. Therefore, the degree of attachment of the driver elements 5 to the long side surface 40b is a great concern. Specifically, in the structure in which the reaction force from the drive target is exerted on the driver elements 5 and the long side surface 40b in the direction inclined relative to the normal direction of the long side surface 40b, the structure in which the driver elements 5 are attached to the long side surface 40b with the attachment surfaces 51 in surface contact with the long side surface 40b is particularly effective, as described above.

The size of the attachment surface 51 of the driver element 5, more specifically, the width thereof in the vibration direction of the longitudinal vibration, is defined so that the normal n at the point of contact c between the driver element 5 and the disc body 2 passes through the attachment surface 51. As a result, the reaction force exerted on the driver element 5 by the disc body 2 can be received by the attachment surface 51 and the long side surface 40b, and the driver element 5 can be prevented from coming off the long side surface 40b.

Further, when the reaction force is exerted on the driver element 5 by the disc body 2, part of the reaction force exerted in the shearing direction of the attachment surface 51 and the long side surface 40b is prevented from becoming greater than the other part of the reaction force exerted in the perpendicular direction of the attachment surface 51 and the long side surface 40b by defining the radius r of the driver element 5 and the diameter x of the attachment surface 51 so as to satisfy the expression (3). This makes it possible to reliably prevent the driver element 5 from coming off the long side surface 40b.

Further, by arranging the driver elements 5 at positions on the long side surface 40b corresponding to the antinodes of the bending vibration of the piezoelectric element 40, the driver elements 5 can be attached to the positions on the long side surface 40b where the rate of change in bending displacement is small. Therefore, the disturbance of the bending deformation of the long side surface 40b by the driver elements 5 can be suppressed to a further extent.

Embodiment 2

A drive unit according to Embodiment 2 of the present invention will be described. In a drive unit 201 according to Embodiment 2, the structure of an ultrasonic actuator 203, particularly the structures of an actuator body 204 and a driver element 205, is different from the structure of the ultrasonic actuator 3 of Embodiment 1.

Figure 9:
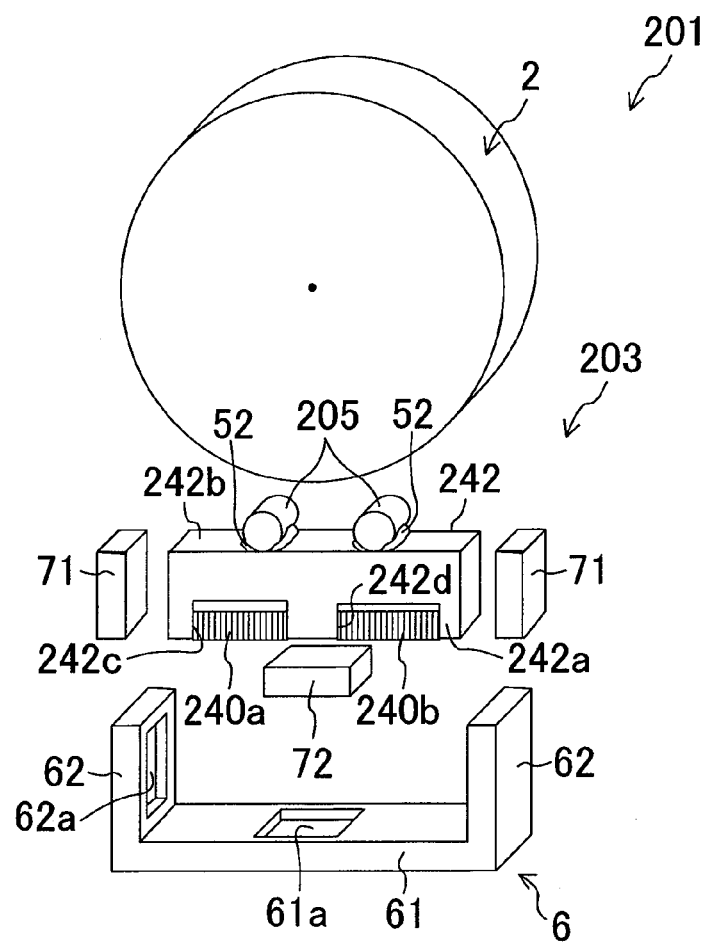
FIG. 9 is an exploded perspective view illustrating the structure of an ultrasonic actuator according to Embodiment 2.

Specifically, as shown in FIG. 9, the actuator body 204 includes a resonator 242, piezoelectric elements 240a and 240b arranged in the resonator 242, and power supply electrodes (not shown) attached to the piezoelectric elements 240a and 240b, respectively.

The resonator 242 is a substantially in the shape of a rectangular parallelepiped made of metal such as stainless steel and an aluminum alloy, or an insulating material such as ceramic. The resonator 242 has two arrangement holes 242c and 242d aligned in the longitudinal direction at one lateral end of a substantially rectangular principle surface 242a (one of the two surfaces having the largest area among the six surfaces).

Each of the piezoelectric elements 240a and 240b is made of a piezoelectric material such as lead zirconate titanate or quartz, and shaped into a flat plate which is rectangular when viewed in plan. The piezoelectric element 240a (240b) has power supply electrodes (not shown) formed uniformly on the opposing surfaces thereof. The piezoelectric elements 240a and 240b are contained in the arrangement holes 242c and 242d of the resonator 242, respectively.

Figure 10:
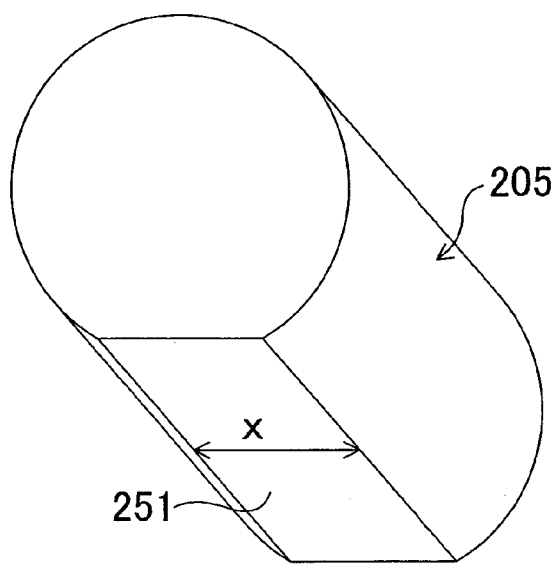
FIG. 10 is a perspective view of a driver element.

Each of the driver elements 205 is basically in the shape of a cylindrical column which is partially truncated to form a flat section parallel to the axis of the cylindrical column, as shown in FIG. 10. The flat section constitutes a rectangular attachment surface 251. Each of the driver elements 205 is adhered to a long side surface 242b (a side surface which is orthogonal to the principle surface 242a and extends in the longitudinal direction of the principle surface 242a) of the resonator 242 through the attachment surface 251 using an adhesive 52. The driver elements 205 may be made of zirconia, alumina, silicon nitride, silicon carbide, tungsten carbide, or other material.

The driver elements 205 are provided on parts of the long side surface 242b located at a distance of about 30% of the full length of the long side surface 242b inwardly from both edges thereof in the longitudinal direction, with the axis of the cylindrical column parallel to a lateral direction of the long side surface 242b (a thickness direction of the resonator 242). Each of the locations of the driver elements 205 corresponds to an antinode of a second mode of a bending vibration to be described later, where the bending vibration is the maximum.

By applying predetermined AC voltages to the piezoelectric elements 240a and 240b, respectively, the resonator 242 is induced to harmonically generate a longitudinal vibration and a bending vibration. More specifically, by alternately allowing the piezoelectric elements 240a and 240b to generate the longitudinal vibration at the predetermined frequencies, the resonator 242 performs the longitudinal vibration in the longitudinal direction of the piezoelectric elements 240a and 240b, i.e., the longitudinal direction of the resonator 242. At the same time, since the piezoelectric elements 240a and 240b are arranged only on the one lateral end of the resonator 242, one side in the longitudinal direction (a side corresponding to the piezoelectric element 240a) and the other side in the longitudinal direction (a side corresponding to the piezoelectric element 240b) of the one lateral end of the resonator 242 expand and contract alternately. As a result, the resonator 242 performs the bending vibration in the lateral direction.

Respective resonance frequencies of the longitudinal vibration and the bending vibration are determined by a material, a shape and the like of the resonator 242. Furthermore, the resonance frequencies are both influenced by a force supporting the resonator 242 and a position where the resonator 242 is supported. Taking this into consideration, the resonance frequencies are made to substantially match each other. AC voltages having a frequency around the resonance frequencies and phases shifted by 90° from each other are applied to the piezoelectric elements 240a and 240b, respectively. Thus, the first mode of longitudinal vibration and the second mode of bending vibration are harmonically induced in the resonator 242, so that the resonator 242 changes itself into shapes shown in FIGS. 6(a), 6(b), 6(c) and 6(d) in this order, in the same manner as the actuator body 4 of Embodiment 1. As a result, each of the driver elements 205 provided on the resonator 242 makes an orbit motion, more specifically, a substantially elliptical motion, in a plane including the longitudinal direction of the long side surface 242b of the resonator 242 (the vibration direction of the longitudinal vibration) and the normal direction of the long side surface 242b (the vibration direction of the bending vibration).

Just like the sections of the driver elements 5 of Embodiment 1, sections of the driver elements 205 which are orthogonal to the rotation axis X of the disc body 2, i.e., sections parallel to the plane including the longitudinal direction of the long side surface 242b of the resonator 242 (i.e., the vibration direction of the longitudinal vibration) and the vibration direction of the bending vibration, are substantially round (in a strict sense, the sections of each of the driver element 205 is almost round-shaped with a certain circular segment part cut off). The driver elements 205 are also configured to satisfy the above-described expressions (1) to (5). Regarding the expressions (1) to (5), r denotes the radius of the driver element 205 basically in the shape of a cylindrical column, x denotes the width of the attachment surface 251 of the driver element 205 in the direction orthogonal to the axis of the cylindrical column, i.e., the width in the vibration direction of the longitudinal vibration of the resonator 242.

According to Embodiment 2, just as described in Embodiment 1, in the structure in which the driver elements 205 are attached to the long side surface 242b of the resonator 242, which is the side surface which makes the bending deformation, the width×of the attachment surface 251 of each of the driver elements 205 in the vibration direction of the longitudinal vibration is defined smaller than the width of each of the driver elements 205 in the vibration direction of the longitudinal vibration, i.e., the diameter 2r, so that the contact area between each of the driver elements 205 and the long side surface 242b is reduced. This makes it possible to suppress the disturbance of the bending deformation of the long side surface 242 by the driver elements 205. Although the contact area between the driver element 205 and the long side surface 242b is reduced, they are not brought into point contact or linear contact. Instead, the driver element 205 is provided with the attachment surface 251 so that the driver element 205 is attached to the long side surface 242b with the attachment surface 251 in surface contact with the long side surface 242b. This allows securing firm attachment of the driver element 205 to the long side surface 242b.

Except for the feature described above, the advantages and effects of Embodiment 2 are similar to those of Embodiment 1.

With use of the cylindrical columnar driver elements 205, the contact area with the disc body 2 is increased. Therefore, the shape of the driver elements 205 is less likely to be changed due to wear, and the ultrasonic actuator can be provided with high reliability.

Other Embodiments

The above-described embodiments of the present invention may be configured as follows.

Embodiment 1 has described the ultrasonic actuator 3 in which the driver elements 5, each of which is substantially in the shape of a sphere which is at least partially truncated to form a flat section, are attached to the piezoelectric element 40. Further, Embodiment 2 has described the ultrasonic actuator 203 in which the driver elements 205, each of which is substantially in the shape of a cylindrical column which is at least partially truncated to form a flat section parallel to the axis of the cylindrical column, are attached to the resonator 242 including the piezoelectric elements 240a and 240b. However, the present invention is not limited thereto. For example, an ultrasonic actuator including the substantially cylindrical columnar driver elements 205 attached to the piezoelectric element 40, and an ultrasonic actuator including the substantially spherical driver elements 5 attached to the resonator 242 may be possible. The substantially spherical driver element 5 which is at least partially truncated to form a flat section may additionally be cut at other part, e.g., at part thereof in contact with the drive target. Likewise, the substantially cylindrical columnar driver element 205 which is at least partially truncated to form a flat section parallel to the axis of the cylindrical column may additionally be cut at other part, e.g., at part thereof in contact with the drive target.

According to Embodiments 1 and 2, the piezoelectric element 40 or the resonator 242 constituting the actuator body is in the shape of a rectangular parallelepiped which is rectangular when viewed from the front. However, their shapes are not limited thereto. It is not always necessary that the piezoelectric element or the resonator is rectangular when viewed in plan, or in the shape of a rectangular parallelepiped. The present invention can be applied to any ultrasonic actuator, as long as the driver element is attached to a side surface of the actuator body for performing the bending and longitudinal vibrations which is normal to the vibration direction of the bending vibration.

Further, according to Embodiments 1 and 2, the driver elements 5 (205) are brought into contact with the circumferential surface of the disc body 2. However, the drive target is not limited to the disc body. For example, the driver target may be in the shape of a flat plate, and the driver elements 5 (205) may be brought into contact with a flat surface of the flat-plate drive target. In the structure in which the driver elements 5 (205) are brought into contact with a surface parallel to the long side surface 40b (242b) on which the driver elements 5 (205) are arranged, such as the flat surface of the flat-plate drive target, the biasing force of the bias rubber 72 is exerted on a point of contact between each driver element 5 (205) and the flat surface of the drive target in a direction perpendicular to the long side surface 40b (242b). In driving, a friction force is also applied to the point of contact between the driver element 5 (205) and the flat surface of the flat-plate drive target in the driving direction. The resultant force of them is exerted on a surface of connection between the driver element 5 (205) and the long side surface 40b (242b) in a direction not perpendicular to the long side surface 40b (242b). Therefore, the present invention is also effective for the structure in which the driver elements 5 (205) are brought into contact with the flat surface of the flat-plate drive target.

According to Embodiments 1 and 2, the circumferential surface of the disc body 2 with which the driver elements 5 (205) are brought into contact is parallel to the long side surface 40b (242b) in a direction orthogonal to the vibration direction of the longitudinal vibration and the vibration direction of the bending vibration. Therefore, the reaction force from the disc body 2 is exerted orthogonally to the long side surface 40b (242b) in the direction orthogonal to the vibration direction of the longitudinal vibration and the vibration direction of the bending vibration. However, the present invention is not limited thereto. Specifically, just like in the case where the drive target is spherical, and the ultrasonic actuator 3 (203) is arranged relative to the drive target so that a normal at a point of contact between the driver element 5 (205) and the drive target is inclined relative to the long side surface 40b (242b) in the direction orthogonal to the vibration direction of the longitudinal vibration and the vibration direction of the bending vibration, the reaction force from the drive target may be inclined relative to the long side surface 40b (242b) not only in the vibration direction of the longitudinal vibration, but also in the direction perpendicular to the vibration direction of the longitudinal vibration and the vibration direction of the bending vibration. Even in this case, the attachment surfaces 51 (251) of the driver elements 5 (205) have a width not only in the vibration direction of the longitudinal vibration, but also in the direction perpendicular to the vibration direction of the longitudinal vibration and the vibration direction of the bending vibration. Therefore, firm attachment of the driver elements 5 (205) to the long side surface 40b (242b) can be achieved also in the direction perpendicular to the vibration direction of the longitudinal vibration and the vibration direction of the bending vibration, and the driver elements 5 (205) can be prevented from coming off the long side surface 40b (242b).

According to Embodiments 1 and 2, the sections of the driver elements which are parallel to the plane including the vibration direction of the longitudinal vibration and the vibration direction of the bending vibration are substantially round. However, the present invention is not limited thereto. Specifically, the section of the driver element is not necessarily round. The section of the driver element may have any other shape, e.g., it may be in the shape of a polygon, or a combination of a polygon and a circular segment. Even in this case, the width of the attachment surface of the driver element in the vibration direction of the longitudinal vibration is defined smaller than the maximum width of the driver element in the vibration direction of the longitudinal vibration.

According to Embodiments 1 and 2, power is supplied to the piezoelectric elements through the wires. However, the present invention is not limited thereto, and the power supply can be performed in any other method. For example, the support rubbers and the bias rubber are made of conductive rubber, so that the power supply to the piezoelectric element of the actuator body can be performed from the power supply electrodes formed on the case through the support rubbers and the bias rubber.

According to Embodiments 1 and 2, the first mode of the longitudinal vibration and the second mode of the bending vibration have been described. However, the present invention can be applied to a combination of the first mode of the longitudinal vibration and the fourth mode of the bending vibration, a combination of other vibrations, or a combination of other modes.

The support members placed between the actuator body and the case are all made of elastic bodies. However, at least one of them may be the elastic body. The similar effects can also be obtained when a single annular support member is arranged to surround the piezoelectric element, and part of the support member to be connected to the piezoelectric element is made of the elastic body.

According to the embodiments described above, a single-plate structure in which power supply elements are formed on the surfaces of the piezoelectric element has been adopted. However, the similar advantages and effects can be obtained by a layered structure in which electrode layers and piezoelectric layers are stacked. In this case, an external electrode in electrical conduction with the electrode layers is formed on an outer surface of the layered structure. Then, a wire is connected to the external electrode, or a support rubber and a bias rubber made of conductive rubber are brought into contact with the external electrode, so as to apply a voltage to the electrode layers.

The structure of the power supply electrodes of the piezoelectric element 40 described in Embodiment 1 is the simplest one including four-piece electrodes formed on four divided areas of one of the principle surfaces and a full surface electrode formed on the other principle surface. However, the similar advantages and effects can be obtained even when the power supply electrodes are constituted of two-piece electrodes or five-piece electrodes formed on two or five divided areas of the principle surface.

The above embodiments are merely preferred embodiments in nature, and are not intended to limit the scope, applications and use of the invention.

As described above, the present invention is useful for an ultrasonic actuator including an actuator body performing a plurality of vibrations including a bending vibration.

What is claimed is:

1. An ultrasonic actuator comprising:
    an actuator body having a piezoelectric element and performing a bending vibration and a longitudinal vibration; and
    a driver element which is attached to the actuator body and, in response to the bending vibration and the longitudinal vibration of the actuator body, outputs a driving force by making an orbit motion in a plane including a vibration direction of the bending vibration and a vibration direction of the longitudinal vibration, wherein
    a width of an area where the driver element is in contact with the actuator body in the vibration direction of the longitudinal vibration is smaller than a maximum width of the driver element in the vibration direction of the longitudinal vibration.

2. The ultrasonic actuator of claim 1, wherein
    the driver element is attached to the actuator body in the vibration direction of the bending vibration.

3. The ultrasonic actuator of claim 1, wherein
    the driver element is attached to a non-node part of the bending vibration of the actuator body.

4. The ultrasonic actuator of claim 1, wherein
    the driver element is attached to an antinode of the bending vibration of the actuator body.

5. The ultrasonic actuator of claim 1, wherein
the driver element is in contact with a circumferential surface of a drive target which rotates about a rotation axis orthogonal to the plane including the vibration direction of the bending vibration and the vibration direction of the longitudinal vibration, and applies a driving force to the drive target.

6. The ultrasonic actuator of claim 5, wherein
the driver element is configured so that a normal at a point of contact between the driver element and the drive target passes through the area.

7. The ultrasonic actuator of claim 5, wherein
two driver elements are attached to the side surface of the actuator body to be aligned in the vibration direction of the longitudinal vibration,
sections of the driver elements and the drive target which are parallel to the plane including the vibration direction of the bending vibration and the vibration direction of the longitudinal vibration are substantially round, and suppose that a distance between centers of the two driver elements in the vibration direction of the longitudinal vibration is l, a radius of the driver element is r, a width of the area of the driver element in the vibration direction of the longitudinal vibration is x, and a radius of the drive target is R, the following expression (2):

$$x > rl/(R+r) \quad (2)$$

is satisfied.

8. The ultrasonic actuator of claim 7, wherein
the driver element satisfies the following expression (3):

$$x < \sqrt{\sqrt{2}r} \quad (3).$$

9. The ultrasonic actuator of claim 1, wherein the actuator body performs a first mode of the longitudinal vibration and a second mode of the bending vibration.

* * * * *